United States Patent [19]

Aklufi

[11] 4,450,041
[45] May 22, 1984

[54] CHEMICAL ETCHING OF TRANSFORMED STRUCTURES

[75] Inventor: Monti E. Aklufi, San Diego, Calif.

[73] Assignee: The United States of America as represented by the Secretary of the Navy, Washington, D.C.

[21] Appl. No.: 390,458

[22] Filed: Jun. 21, 1982

[51] Int. Cl.³ .......................... C23F 1/02; B44C 1/22; C03C 15/00; H01L 21/306
[52] U.S. Cl. ................... 156/628; 156/603; 156/643; 156/656; 156/657; 156/662; 156/DIG. 64; 156/DIG. 80; 156/DIG. 111; 427/86
[58] Field of Search ............... 156/628, 643, 656, 657, 156/662, 603, 608, DIG. 64, DIG. 80, DIG. 88, DIG. 111; 148/1.5, 187; 427/86

[56] References Cited

U.S. PATENT DOCUMENTS

| 3,585,088 | 6/1971 | Schwuttke et al. | 156/603 |
| 3,615,935 | 10/1971 | O'Keeffe | 148/187 |
| 3,666,548 | 5/1972 | Brack et al. | 156/643 X |
| 3,682,729 | 8/1972 | Gukelberger et al. | 156/628 X |
| 3,769,109 | 10/1973 | MacRae et al. | 156/643 |
| 3,853,648 | 12/1974 | Janus et al. | 156/628 |
| 4,319,954 | 3/1982 | White | 156/628 |

FOREIGN PATENT DOCUMENTS 56-76536  6/1981  Japan ................... 156/628

Primary Examiner—William A. Powell
Attorney, Agent, or Firm—R. F. Beers; E. F. Johnston; Harvey Fendelman

[57] ABSTRACT

A maskless technique is disclosed for shaping semiconductor materials by forming areas that are selectively etchable with respect to the rest of the structure. In one embodiment of this invention, a body of amorphous material is subjected to radiation by a focused energy beam so as to convert a predetermined region of the amorphous material into a region of crystalline material. The converted region etches at a slower rate than the non-converted amorphous material. In a second embodiment of the present invention, a method of selectively etching a metal is disclosed which includes the step of subjecting a predetermined region of the metal to be impinged upon by a shaped ion beam so as to ion implant the predetermined region. A chemical etch is applied to the metal and to the ion implanted region of the metal and the ion implanted region etches at a slower rate than the portion of the metal outside the ion implanted region. In another embodiment of the present invention, a method of selectively etching a dielectric is disclosed which includes the step of subjecting a predetermined region of the dielectric to be impinged upon by a shaped ion beam so as to ion implant the predetermined region. A chemical etch is applied to the dielectric and to the ion implanted region of the metal and the ion implanted region etches at a faster rate than the portion of the dielectric outside the ion implanted region.

1 Claim, 12 Drawing Figures

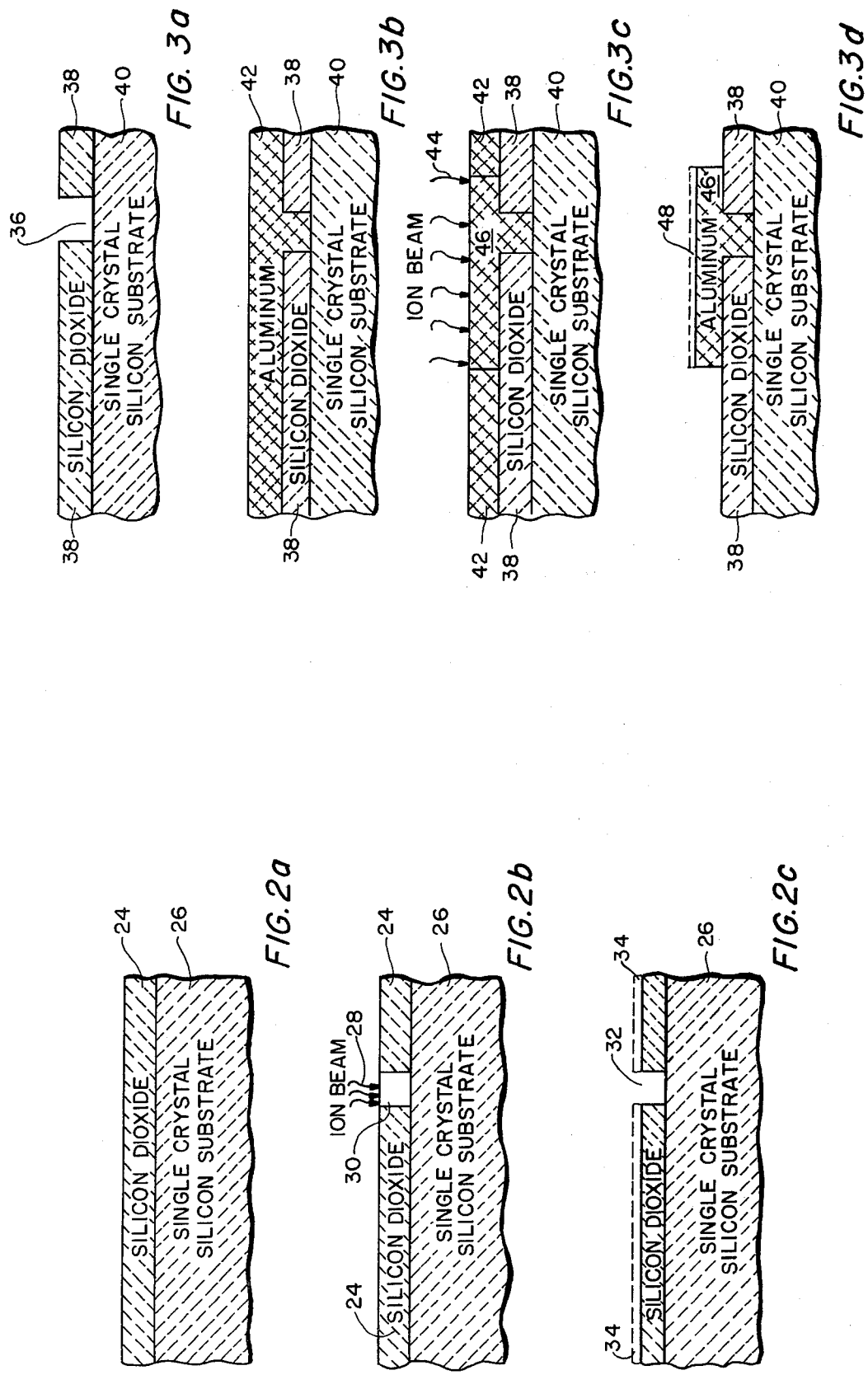

CHEMICAL ETCHING OF TRANSFORMED STRUCTURES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to the field of semiconductor device manufacturing and, more particularly, to the field of shaping semiconductor materials by chemical etching.

In the fabrication of integrated circuits, techniques for selectively shaping materials such as single crystal silicon, polycrystalline silicon films, dielectric films and metal layers have required the use of lithographic masking and chemical etches, milling and combinations thereof to shape the films and layers. As an example, semiconductor devices such as transistors and integrated circuits are commonly fabricated in silicon using a mask of silicon dioxide for the selective introduction of dopants. The practice is to open windows in the oxide layer by etching through defined holes in a photoresist mask. The photoresist operations for each diffusion require first applying the photoresist, exposing it through an optical mask, developing it, and removing it after the oxide etching is completed. Photoresist operations are a major factor in determining device yield and result in a relatively large part of fabrication costs. These masking, etching and milling techniques have in part restricted the formation of optimum structures and the reliability of integrated circuits. The resulting disadvantages have been limited device operation, lower circuit densities, lower yield and reliability, and higher processing costs.

SUMMARY OF THE INVENTION

The present invention relates to a technique to enable greater circuit densities, reduce processing costs, improve device operation yield and reliability. This is accomplished by transforming the structure of a material by ion and/or energy beams such that the regions impacted by these beams etch at a different rate than the non-perturbed regions. The present invention relates to the use of ion beams utilized to transform crystalline materials into amorphous ones such that the amorphous materials are selectively etchable. The present invention further relates to the use of energy beams to transform amorphous materials into crystalline materials such that the crystalline materials are selectively etchable. Further, the present invention relates to a technique of using ion beams to ion implant metals, thereby making the metals selectively etchable. If the implanted ions are not capable of forming alloys, glasses or chemical compounds with the material being implanted, the transformed regions maybe converted back to the original untransformed condition by heating.

In a first embodiment of the present invention, a predetermined region of a body of amorphous material is subjected to radiation by an energy beam thereby converting the predetermined region of amorphous material into a region of crystalline material. It has been discovered that subsequently applying a chemical etch to the body of amorphous material and to the region converted into crystalline material, the converted region etches at a slower rate than the portion of the body of amorphous material outside the predetermined region. It has also been discovered that by subjecting a predetermined region of a layer of metal to be impinged upon by an ion beam so as to ion implant the predetermined region, and by applying a chemical etchant to the layer of metal and to the ion implanted region, the ion implanted region etches at a slower rate than the portion of the metal layer outside the ion implanted region. In these embodiments the ion and energy beams can be used in conjunction with masking techniques so as to transform regions only in unmasked areas. The transformed regions can now be removed more selectively than by masking alone. This results in very well defined areas required in fine line lithography whose feature sizes may be in submicrometer range, to a level heretofore unattainable. However, with the use of focused ion and/or energy beams, these techniques thus constitute a maskless etching process thereby obviating the necessity of fabrication of masks and obviating lithographic processes previously utilized in semiconductor device fabrication. The technique of applying a controlled energy beam to a body of amorphous material to selectively convert a region of the amorphous material to a crystalline structure is the subject of copending U.S. patent application, Ser. No. 080,846 filed Oct. 1, 1979 in the name of the present inventor, the disclosure of that copending patent application being herein incorporated by reference in its entirety.

OBJECTS OF THE INVENTION

Accordingly, it is the primary object of the present invention to disclose a novel materials transformation technique.

It is a further object of the present invention to disclose a technique for chemical etching which may be used with or without the use of lithographic masking techniques by converting a region of amorphous material into a crystalline structure to reduce the etch rate of the converted region.

It is another object of the present invention to disclose a technique of reducing the etch rate of a metal layer by ion implanting a selected region of the metal such that the ion implanted region of the metal etches at a slower rate than the remainder of the metal.

It is another object of the present invention to disclose a technique of increasing the etch rate of dielectric layers by implanting a selected region of the dielectric such that the ion implanted region of the dielectric etches at a faster rate than the remainder of the dielectric.

Other objects and many of the attendant advantages of this invention will be readily appreciated as the same becomes better understood by reference to the following detailed description when considered in connection with the accompanying drawings.

DESCRIPTION OF THE DRAWINGS

FIG. 2a, FIG. 2b and FIG. 2c are partial, cross-sectional views of a semiconductor structure at successive stages in its fabrication in accordance with another embodiment of the present invention.

FIG. 3a, FIG. 3b, FIG. 3c and FIG. 3d are partial, cross-sectional views of successive stages in the fabrication of a metal interconnect layer according to one embodiment of the present invention.

DESCRIPTION OF THE PREFERRED EMBODIMENTS

Figure 1A:
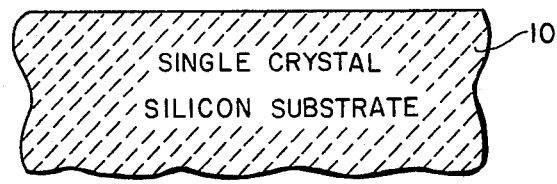
FIG. 1a, FIG. 1b, FIG. 1c, FIG. 1d and FIG. 1e are partial, cross-sectional views of a semiconductor structure at successive stages in its fabrication in accordance with this invention.
Figure 1B:
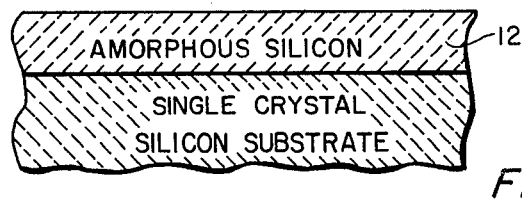
Figure 1C:
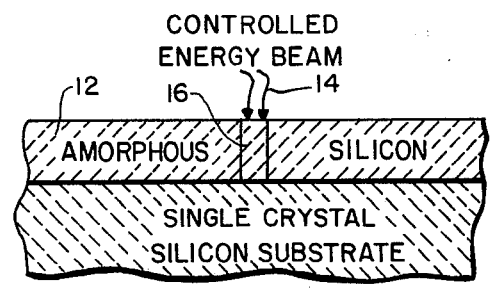
Figure 1D:
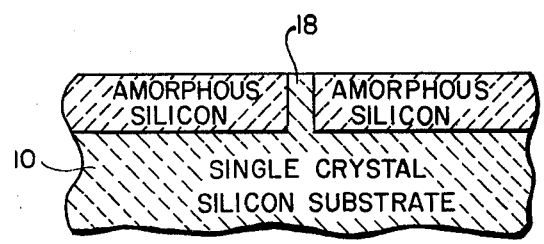
Figure 1E:
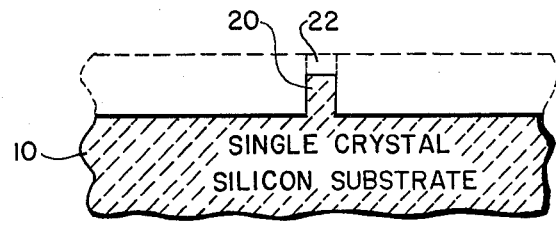

Referring now to FIGS. 1a through 1e, inclusive, the successive steps towards the fabrication of a mesa region atop of a substrate according to one embodiment of the present invention will now be described. The substrate 10 is illustrated in FIG. 1a and may be a single crystal silicon substrate of either the n or p-type. It is to be understood, however, that other crystalline substrates, either single or polycrystalline, could be employed within the scope of the present invention dependent only upon its particular application. As illustrated in FIG. 1b, a layer 12 of amorphous silicon is deposited upon the single crystal silicon substrate 10. The deposition of the amorphous layer 12 can be accomplished by the well known techniques of vacuum deposition and by chemical vapor depositions when deposited at temperatures below 650 degrees centigrade, the silicon crystallization temperature. Further, the amorphous silicon region may be formed by the transformation of the top layer of the single crystal silicon substrate by the application of ion beams to the region. The depth of the amorphous region is determined by the energy of the ion beam and the atomic masses of the ion and the substrate material. FIG. 1c illustrates a controlled energy beam 14 impinging upon the amorphous silicon layer 12 in region 16, making region 16 undergo a change in structure. The energy beam 14 can be a laser beam or electron beam capable of supplying sufficient energy to convert the amorphous layer 12 into a crystalline structure within the region 16. The technique of so converting the amorphous layer 12 to a crystalline structure in region 16 by application of the controlled energy beam 14 is described more fully in copending U.S. patent application, Ser. No. 080,846 referred to above and incorporated by reference herein. In FIG. 1d, the transition region 16 under the controlled energy beam 14 has been converted into a single crystal silicon mesa 18 having a crystal structure of the same orientation as that of the single crystal substrate 10. Illustrated in FIG. 1e, a silicon chemical etch has been used to define the mesa region 20 without the use of a mask. As is depicted in FIG. 1e by dotted lines, the portion of the amorphous layer 12 of silicon outside of region 16 has been completely removed by the chemical etch. The removal of material from region 22 also results when masking is not used. However, it should be readily appreciated that, due to the differential etch rates brought about by crystallization of the amorphous silicon 12 in the region 16, the result is the formation of the mesa region 20 on top of the single crystal silicon substrate 10 without the use of a mask. It is noted that the use of the controlled energy beam 14 to form the single crystal mesa region 20 and the subsequent etch of the amorphous material 12 around the mesa 20 has resulted in a "positive image", i.e., the material upon which the controlled energy beam was caused to impinge has remained.

With reference now to FIGS. 2a through 2c, the successive steps towards the fabrication of an opening or window in a dielectric film on a substrate will now be described. The dielectric is illustrated in FIG. 2a as film 24 which may, for example, be silicon dioxide, and is formed by known techniques on top of single crystal silicon substrate 26. It is to be understood, however, that other dielectrics and substrates or combinations thereof could be employed within the scope of the present invention dependent only upon the particular application intended. For example, a dual dielectric layer consisting of a thin silicon nitride film on top of a thicker silicon dioxide film could be used. Additionally, the substrate could be a dual layer consisting of a thin silicon layer on top of a thick crystalline dielectric layer such as sapphire. As is illustrated in FIG. 2b, a shaped ion beam 28 is directed to impinge on the silicon dioxide film 24 within the region 30, making region 30 undergo a change in structure. This change in structure within region 30 produced by the ion beam 28 allows region 30 to be selectively etched with respect to the regions not perturbed by the ion beam 28. By increasing the atomic number of the ion and the dosage, i.e., ions per square centimeter, the rate at which the transformed region 30 etches can be increased. For maximum selectivity, the beam 28 should penetrate up to the full thickness of the film 24 to be transformed. The energy of beam 28 used is therefore dependent on the film thickness and its penetrating characteristics into the film. For substantially thick films, a dual dielectric layer as mentioned previously could be used. In such case the top film is transformed and used as a mask for the thicker lower films. As illustrated in FIG. 2c, a chemical etch has been used to define window 32 without the use of a mask. The removal of region 34 film also results when masking is not provided for. The dielectric within region 30 which has undergone a change has been found to etch at a rate greater than that of the portion of dielectric film 24 outside of region 30. For example, implanting $1 \times 10^{14}$ arsenic ions per square centimeter at an energy of 100 keV into 1000 angstroms of silicon dioxide results in the transformed silicon dioxide within region 30 etching at a rate three times that of the untransformed silicon dioxide when etched with a mixture of 10 parts deionized water to one part hydrofluoric acid (47%) at 21 degrees centigrade. The etch rates of transformed structures can be further increased by including chemical effects. By using phosphorous ion beams and chemical etches such as 15 parts hydrofluoric acid, 10 parts nitric acid and 300 parts deionized water, the selectivity between a phosphorous ion beam transformed silicon dioxide structure and non-transformed silicon dioxide regions is greatly enhanced.

With reference now to FIGS. 3a through 3d, inclusive, the successive steps toward the fabrication of a metal interconnect layer according to one embodiment of the present invention will now be described. Illustrated in FIG. 3a is window 36 within silicon dioxide layer 38 formed on top of single crystal silicon substrate 40. The window 36 may be formed by the technique previously described above with respect to FIG. 2 or a conventional photolithographic masking process may be utilized. A metal film shown in FIG. 3b as film 42 which may, for example, be aluminum is deposited by well known techniques on top of the silicon dioxide layer 38 and within window 36 such that it extends to the silicon substrate 40. It is to be understood, however, that metals other than aluminum, dielectrics other than silicon dioxide and substrates other than single crystal silicon could be employed within the scope of the present invention. As illustrated in FIG. 3c, a shaped ion beam 44 is directed to impinge upon the aluminum film 42 within region 46, making region 46 undergo a change in structure. This change in structure produced by the ion beam 44 reduces the etch rate of the transformed structure within region 46 when compared to the aluminum regions not perturbed, i.e., the portion of the aluminum film 42 outside of region 46. By increasing the number of ions per square centimeter used, one can decrease further the rate at which the transformed region 46 etches. For maximum selectivity, the beam 44 should penetrate up to the full thickness of the film 42 to be transformed. The beam energy used is therefore dependent on the film thickness and its penetrating characteristics into the film. For substantially thick films, a dual metallic layer could be used. In this case the top film would be transformed and used as a mask for the thicker lower film and then could be subsequently removed. In FIG. 3d, a chemical etch has been used to define the transformed metal interconnect region 46. The removal of region 48 of the film 42 also results when masking is not provided for. The metal which has undergone a change of structure within region 46 has been found to etch at a rate less than that of the untransformed region of film 42, i.e., the portion of film 42 outside of region 46. For example, implanting $1 \times 10^{15}$ silicon atoms per square centimeter at an energy of 200 keV into 3500 angstroms of aluminum results in the transformed aluminum etching at 1/10 the rate of that of the portion of film 42 that has not been transformed when etched with a mixture of 350 parts of phosphoric acid, 25 parts of deionized water, 15 parts of nitric acid and 75 parts of acetic acid at 55 degrees centigrade. For maximum selectivity, heating due to the ion beam 44 should be avoided by proper cooling techniques.

It may thus be readily appreciated that channel region, mesa regions and interconnects may all be formed according to the maskless process of the present invention. The present invention may be utilized to form P-M junctions, NMOS source and drain regions, emitter junctions, emitter base and collector electrodes, as well as practically any other semiconductor structure requiring the formation of mesas, windows, channels and/or interconnect regions.

Obviously, many other modifications and variations of the present invention are possible in the light of the above teachings. It is therefore to be understood that within the scope of the appended claims the invention may be practiced otherwise than as specifically described.

What is claimed is:

1. A method of selectively etching a metal comprising the steps of:
    (a) subjecting a predetermined region of a layer of metal to impingement by a silicon ion beam so as to ion implant said predetermined region;
    (b) applying a chemical etch to said layer of metal and to said ion implanted region whereby said ion implanted region etches at a slower rate than the portion of said metal outside said predetermined region.

* * * * *